United States Patent [19]
Sheehan, III

[11] 3,713,741
[45] Jan. 30, 1973

[54] METHODS OF AND APPARATUS FOR LOCATING SOLDER FAULTS

[75] Inventor: Leo J. Sheehan, III, Reading, Mass.

[73] Assignee: Western Electric Company, Incorporated, New York, N.Y.

[22] Filed: Jan. 3, 1972

[21] Appl. No.: 215,002

[52] U.S. Cl. ............356/165, 250/219 DF, 250/226, 356/237

[51] Int. Cl...........G01b 9/08, G01r 21/30, G01j 3/34

[58] Field of Search........356/165, 166, 168, 71, 200, 356/237, 173; 250/219 DF, 226

[56] References Cited

UNITED STATES PATENTS 3,617,744 11/1971 Irish ....................................356/165
3,264,105 8/1966 Houtz, Jr..............................96/36.2

*Primary Examiner*—Ronald L. Wibert
*Assistant Examiner*—Conrad Clark
*Attorney*—W. M. Kain et al.

[57] ABSTRACT

Solder faults occurring between the soldered circuit paths of a printed circuit board are visually located by filtering colored light reflected from the paths and faults with a filter of a configuration identical to the circuit paths. The light reflected from the paths passes through the filter and emerges a different color than the light reflected from the faults which is either unfiltered or filtered to remove different wave lengths of light. This filtration process results in images of the circuit paths being one color and images of the faults being another.

13 Claims, 2 Drawing Figures

METHODS OF AND APPARATUS FOR LOCATING SOLDER FAULTS

BACKGROUND OF THE INVENTION

1. Field of the Invention

This invention relates to methods of and apparatus for locating anomalies disposed within a prescribed pattern of objects and more particularly to methods of and apparatus for using radiant energy in locating solder faults occurring between circuit paths on a printed circuit board.

2. Technical Consideration and Prior Art

In the manufacturing of printed circuit boards, circuit paths are coated with solder by drag, wave or dip soldering processes. Frequently, these processes result in faults or anomalies such as undesired crossovers of solder between circuit paths and spurious adhesions of solder to the circuit board substrate. These faults are troublesome because they often result in short circuits and cause other difficulties which might otherwise damage or cause malfunction in the circuit or associated equipment. Accordingly, these faults should be removed.

Generally, the faults are discovered through visual inspection; however, due to the complexity of the circuit paths and the high reflectivity of the new solder that coats them, the faults are often difficult to locate with the unaided eye. In addition, inspection of the circuit paths is very tiring to the eyes resulting in productivity losses and increased occurrences of overlooked faults.

SUMMARY OF THE INVENTION

It is therefore an object of this invention to provide new and improved methods of and apparatus for locating anomalies in a prescribed array of objects.

It is another object of this invention to provide new and improved methods of and apparatus for locating solder faults occurring between and adjacent to circuit paths or printed circuit boards.

It is a further object of this invention to provide new and improved methods of and apparatus for locating randomly occurring objects within a prescribed array of similar objects by reflecting light from the objects and selectively filtering light reflected from the prescribed array of objects in a different manner than the light reflected from the randomly occurring objects to disclose the location of the random objects in relation to the array.

In accordance with these and other objects, methods of and apparatus for practicing this invention may include visually isolating a prescribed pattern of objects and any randomly occurring similar objects by reflecting chromatic light therefrom which is complementary in color to the color of a chromatic background upon which the objects are mounted. A reflected image of the objects isolated from the background is then projected through a filter configured like the background but having a portion of a different color which is identical in shape to the prescribed pattern. This filtration results in another image in which the prescribed pattern is one color and the random objects are another. Additional filtration limited to the area of the image in which the randomly occurring objects appear may be performed to heighten contrast between the prescribed pattern and randomly occurring objects. On the other hand, the reflected image may be projected through a filter identical in shape but of a color complementary to the color of the reflected image to thereby delete the image of the prescribed pattern altogether and transmit only the image of the randomly occurring objects. When this is the case, the filter may be marked with grid coordinants to facilitate rapid location of the randomly occurring objects.

DETAILED DESCRIPTION

Figure 1:
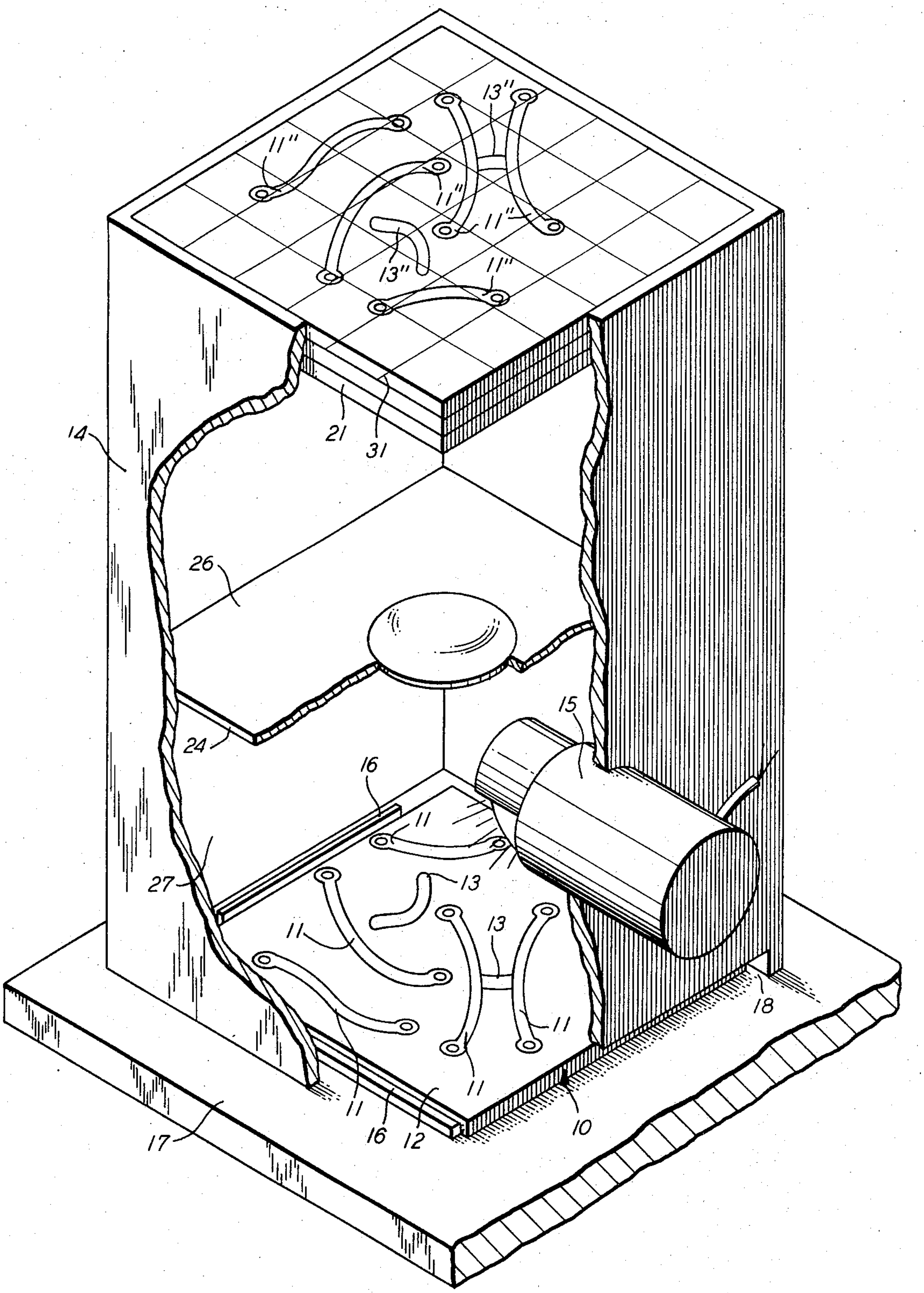
FIG. 1 is an isometric view, partially cut away, of an optical system which may be used to locate random faults occurring in a printed circuit in accordance with the principles of the present invention.

Referring now to FIG. 1, a printed circuit board, designated generally by the numeral 10, is shown with printed circuit paths 11 adhered to a substrate 12. The illustrated printed circuit paths 11 are coated with solder which may have been applied thereto by drag, wave or dip solder processes. In applying solder to the circuit paths 11, undesired deposits of solder such as faults 13 occasionally adhere to the substrate 12 forming random deposits and adhering between juxtaposed paths of the circuit to form crossovers. These deposited faults 13 of course can cause short circuits and other difficulties and therefore must be removed.

Removal of these faults 13 is usually accomplished by simply scraping them off with a small tool; however, locating the faults can be tedious and difficult in that the circuit paths 11 may be quite intricate and rather close together. In addition, freshly applied solder has a high reflectivity. Consequently, since an inspector must peruse scores of boards 10 every day, the inspection process may become very tiring to the eyes. Accordingly, a method which immediately isolates the faults 13 and gives its exact location within the circuit 11 would be quite beneficial.

Referring now to FIG. 1 where apparatus for practicing the method of the invention is shown, the printed circuit board 10 is positioned within an enclosure 14 which shields the board from almost all visible light except that from a light source 15 which projects light onto the board. It is important that all the boards 10 being inspected be identically positioned. Therefore, ribs 16 project from a base 17 upon which the board 14 rests to engage the board 10 on three sides and thereby correctly align it. A slot 18 is formed in one side of the box 14 adjacent to the base 17 to permit the boards 10 to enter into and exit from the box.

The color of the light from the source 15 is preferably complementary to the color of the substrate 12 upon which the circuit 11 is mounted so that the substrate will reflect no light. The circuit 11, which is coated with solder, and any randomly occurring solder faults 13 reflect all visible light impinged thereupon because solder is silver in color and reflects all wave lengths of light. Consequently, the light from the source 15 reflects from the circuit 11 and the faults 13, but is absorbed by the board 10.

Generally, the substrate 12 of the printed circuit board 10 is a chromatic color such as red. Accordingly, if the board is red the light source 15 should project a green light which is the complement of red onto the board 10 in order that the substrate 12 will absorb all light impinging on it from the source and will reflect none. To achieve the proper shade of green a color negative of the red substrate material can be developed and placed over the light source 15 to filter the light radiating from the source.

Figure 2:
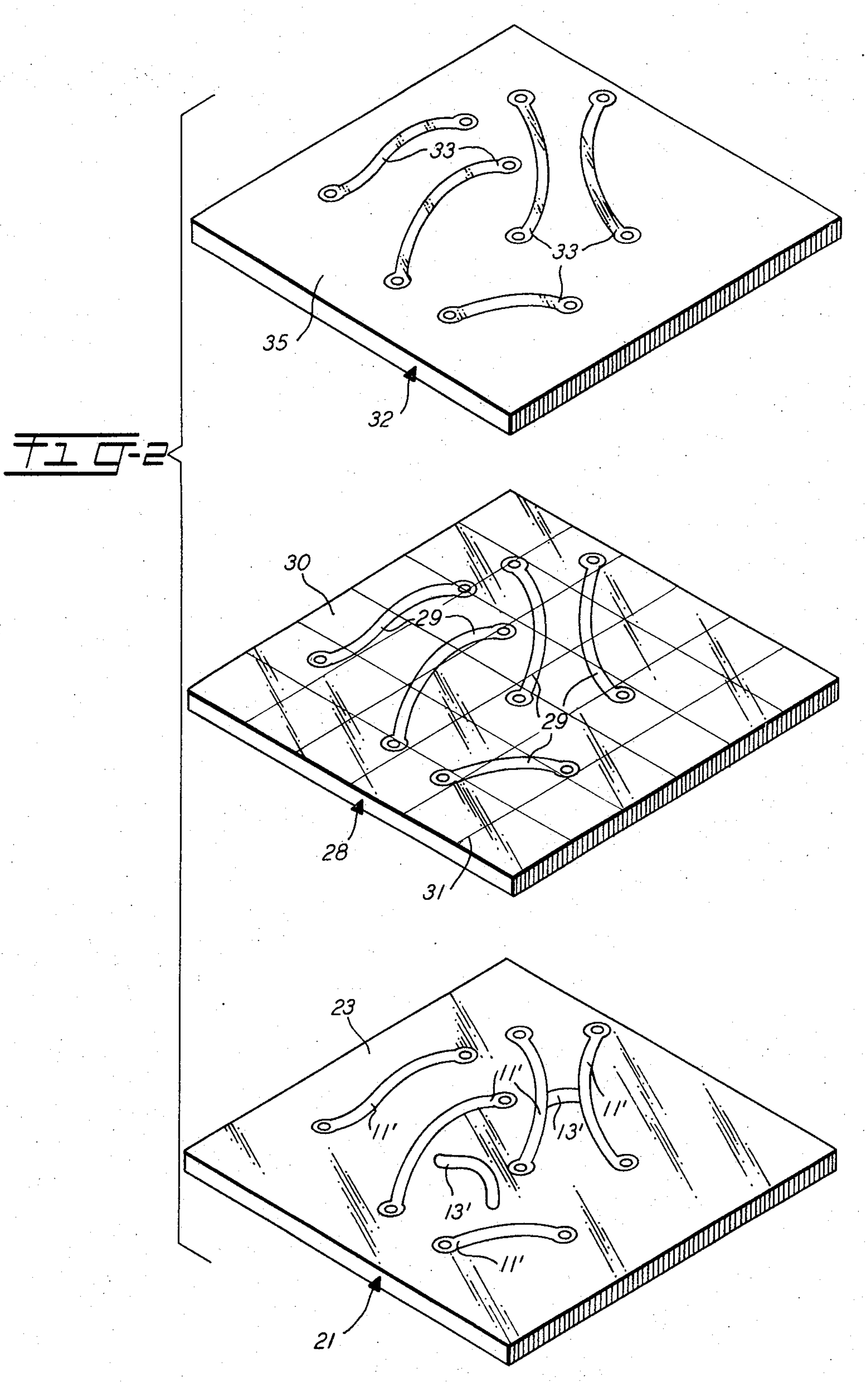
FIG. 2 is an exploded view of the optical system of FIG. 1 showing various elements of which the system is composed.

Referring now to both FIGS. 1 and 2, the light reflecting from the circuit 11 and faults 13 is gathered and focused by a lens 20 onto a screen 21 in a conventional manner so as to produce images 11' and 13' (FIG. 2) of the circuit and the faults on the reverse side 23 of the screen. If the circuit 11 is rather small, the lens 20 can of course magnify the image of the circuit making it easier to see. The lens 20 is mounted in a partition 24 which separates the box 14 into two chambers 26 and 27 in order to achieve clear images 11' and 13' on the screen 21. Since the substrate 12 reflects no light, it is not visible on the reverse side 23 of the screen. The images 11' and 13' of the circuit paths 11 and faults 13 will be in the same color as the light projected from the source 15. In other words if the source 15 projects green light, the images 11' and 13' on the reverse side 23 of the screen 21 will be green.

By illuminating the board 10 with a color complementary to the color of the substrate 12, the substrate is visually eliminated thereby, optically isolating the circuit path 11 and any faults 13 associated therewith. In addition, the glare associated with reflections from the solder surfaces is removed. However, it is still desirable to visually separate the faults 13 from the circuit 11. This is accomplished by filtering the images 11' and 13' with a first filter 28 which has portions 29 which are the exact configuration of the circuit path image 11' as it appears on the reverse side 23 of screen 21. The portions 29 are colored whereas other areas 30 of the filter 28 are clear. The colored portions 29 do not include any configurations corresponding to the images of the random solder faults 13', but only include configurations corresponding to the correct prescribed circuit path 11'. Consequently, the images 13' of faults 13 are not filtered while the image 11' of the circuit path 11 is filtered thereby visually separating the image of the circuit from those of the faults by making the circuit path one color and faults another.

Since the circuit is one color and the faults are another, the location of the faults 13 in relation to the paths of the circuit 11 can be readily determined. For example, if the portions 29 are blue in color and the image 11' is green, then the filtered image of the circuit path will be blue and the faults green because the blue filter eliminates yellow light. On the other hand, if the portions 29 are red (the color complement of green) or black and the image 11' green, the circuit paths image is visually eliminated and the fault image 13' displayed separately. When this is the case, the filter 28 may be marked with grid coordinates 31 so that the location of the faults 13 in relation to a specific area of the printed circuit board 10 can be readily determined.

Additional filtration of the image passing through the filter 28 can be utilized to increase the contrast between the images of the circuit paths 11 and the faults 13. For example, if green light is projected from the source 15 and the colored portions 29 of the filter 28 are blue resulting in a blue circuit path image and green fault images, the contrast may not be sufficient to facilitate easy identification of the faults 13. To increase the contrast between the images of the circuit paths 11 and the faults 13, an additional filter 32 may be employed. The filter 32 has a clear pattern 33 corresponding in shape to the image 11' of the circuit path 11 which allows the blue light of the filtered image to pass through unfiltered. The other portions 35 of the filter 32 are preferably yellow in color so that any images of the faults 13 which appear green on filter 28 will appear yellow on the reverse side 36 of the filter. Accordingly, the desired circuit 11 will appear as a blue image 11'' (FIG. 1) and the faults 13 occurring therein will appear as yellow images 13'' providing enough contrast for an inspector to quickly identify the faults with ease even after scrutinizing numerous circuit boards 10.

It would also be within the scope of this invention to provide just a simple filter such as the filter 32 without utilizing the filter 28. In this case the green light from the circuit path image 11' would, of course, pass through the clear portions 33 of the filter 32 to produce a green image 11'' while the light from the fault images 13' would be filtered by the yellow portions 35 to produce yellow images 13''. This again provides contrasting colors between the images 11'' and 13'' of the circuit paths 11 and faults 13 to facilitate rapid, accurate identification of the faults.

In lieu of visual location of the faults 13, automatic location of the faults can be accomplished by aligning a light sensor (not shown) having a bank of individual photocells (not shown) with a filter arrangement which blocks transmission of all light except that occurring as a result of the faults. Each photocell is aligned with a specific location on the printed circuit board 10 and is energized if a fault 13 occurs within the location with which it is aligned. In addition, each photocell is associated with an output terminal which produces information identifying which photocells, if any, were energized by a particular board 10 thereby indicating the location of the faults 13 on that board.

What is claimed is:

1. A method of visually detecting and locating highly reflective anomalies occurring within a highly reflecrive prescribed pattern wherein both the anomalies and prescribed pattern are set against a chromatic background comprising the steps of:
 illuminating the pattern and anomalies with light complementary in color to the background to isolate the pattern and anomalies from the background,
 focusing light reflected from the pattern and anomalies to produce an image thereof,
 filtering the image selectively to differentiate between the anomalies and the pattern, and
 displaying the filtered image.

2. The method of claim 1 wherein the image is magnified.

3. The method of claim 1 wherein the light reflected from the prescribed pattern is completely filtered while at least some wave lengths of light reflected from the anomalies is passed and displayed.

4. The method of claim 3 wherein the light reflected from the anomalies is displayed in a grid coordinate system to give the location of the anomalies objects.

5. The method of claim 1 wherein the background color is red and the illuminating light is green and wherein the green light reflected from the pattern is passed unfiltered to display a green image while the green light reflected from the anomalies is filtered to display yellow images.

6. The method of claim 1 wherein the background color is red and the illuminating light is green and wherein the green light reflected from the pattern is passed through a yellow filter to display a blue image while the green light reflected from the anomalies is passed through a yellow filter to display a yellow image.

7. A method of visually detecting and locating solder faults occurring within a prescribed array of solder paths wherein both the faults and prescribed solder paths are adhered to a substrate which is of a chromatic color comprising the steps of:

illuminating the solder paths and faults with light complementary in color to the substrate to visually isolate the paths and faults from the substrate, focusing light reflected from the solder paths and faults to produce an image thereof, and filtering the image with a filter having a separate portion which is identical in configuration to the image of the solder paths and is of a color other than that reflected by the solder paths and faults to visually separate the prescribed solder paths from the faults.

8. Apparatus for visually detecting and locating highly reflective anomalies occurring within a highly reflective prescribed pattern wherein both the anomalies and prescribed pattern are mounted on a panel which is of a chromatic color comprising, means for aligning the panel, means for illuminating the pattern and anomalies with light complementary in color to the panel, means for focusing light reflected from the pattern and anomalies to produce an image thereof, a filter having separate areas with configurations identical in shape to the prescribed pattern to differentiate the prescribed pattern from the anomalies when the image is passed therethrough, and means for displaying the image after filtration to determine the location of the anomalies.

9. The apparatus of claim 8 wherein the separate areas of the filter out certain wave lengths of light while the other areas of the filter filter out other wave lengths of light to display an image in which the anomalies appear in one color and the prescribed pattern appears in another.

10. The apparatus of claim 8 wherein the separate areas of the filter are clear while other areas of the filter are tinted with a color other than but not complementary to the illuminating color.

11. The apparatus of claim 8 wherein the separate areas of the filter completely absorb light reflected from the prescribed pattern while other areas of the filter transmit at least some visible wave lengths of light reflected from the anomalies to produce a filtered image of only the anomalies for display.

12. The apparatus of claim 11 wherein the display means is a screen having grid coordinates thereon to aid in determining the location of the anomalies.

13. The apparatus of claim 8 wherein the prescribed pattern and anomalies are solder circuit paths and solder faults, respectively, while the chromatic panel is a printed circuit board.

* * * * *